US012744379B1

(12) United States Patent
Mahamid

(10) Patent No.: US 12,744,379 B1
(45) Date of Patent: Sep. 22, 2026

(54) PREDICTION AND MITIGATION OF ELECTRICAL LOAD SPIKES

(71) Applicant: Musab Mahamid, Umm al-Fahm (IL)

(72) Inventor: Musab Mahamid, Umm al-Fahm (IL)

( * ) Notice: Subject to any disclaimer, the term of this patent is extended or adjusted under 35 U.S.C. 154(b) by 0 days.

(21) Appl. No.: 19/375,348

(22) Filed: Oct. 31, 2025

(51) Int. Cl.
*H02J 3/00* (2026.01)
*H02J 3/0012* (2026.01)
*H02J 3/28* (2026.01)
*H02J 9/06* (2006.01)
*H02J 103/30* (2026.01)
*H02J 105/42* (2026.01)
*H05K 7/20* (2006.01)

(52) U.S. Cl.
CPC ............ *H02J 3/003* (2020.01); *H02J 3/0012* (2020.01); *H02J 3/28* (2013.01); *H02J 9/061* (2013.01); *H05K 7/20827* (2013.01); *H05K 7/20836* (2013.01); *H02J 2103/30* (2026.01); *H02J 2105/425* (2026.01)

(58) Field of Classification Search
CPC .. H02J 3/003; H02J 3/0012; H02J 3/28; H02J 9/061; H02J 2103/30; H02J 2105/425; H05K 7/20827; H05K 7/20836
See application file for complete search history.

(56) References Cited

U.S. PATENT DOCUMENTS 11,581,728 B1 * 2/2023 Pichai ...................... G05B 9/02
11,927,925 B2 * 3/2024 Drees ..................... G06N 5/022
2010/0217550 A1 * 8/2010 Crabtree ................. H02J 13/12 702/62
2014/0088781 A1 * 3/2014 Kearns .................. H02J 13/333 700/295
2015/0121113 A1 * 4/2015 Ramamurthy .......... H02J 9/061 713/340
2018/0059754 A1 * 3/2018 Shaikh .................... G06F 1/263
2020/0073342 A1 * 3/2020 Lee ........................... G05F 1/66
2020/0076196 A1 * 3/2020 Lee ........................ G06Q 50/06
2021/0296897 A1 * 9/2021 Cruickshank, III ...... H02J 3/14
2023/0125240 A1 * 4/2023 Wang .................... G06F 3/0631 711/154
2023/0297453 A1 * 9/2023 Viclizki ................. G06N 3/045 714/47.2
2024/0222970 A1 * 7/2024 Risbeck .................. H02J 3/003
2024/0266831 A1 * 8/2024 Rajaraman .............. H02J 3/003
2025/0118962 A1 * 4/2025 Richmond .............. H02J 3/001
2025/0357756 A1 * 11/2025 Shaton ................ H01M 50/516
2025/0378403 A1 * 12/2025 Monyei ............ G06Q 10/06315

* cited by examiner

*Primary Examiner* — Ziaul Karim

(57) ABSTRACT

There is provided a computer implemented method of managing electrical load spikes in a data center, comprising: monitoring a plurality of telemetry parameters of the data center by a plurality of sensors, the plurality of telemetry parameters including at least one of: temperature, voltage and current, feeding the plurality of telemetry parameters into a machine learning model, generating by the machine learning model, a prediction of an imminent electrical load spike exceeding a predefined threshold, wherein the load spike is predicted to occur in the immediate future, and proactively triggering an energy dispatch prior to the occurrence of the predicted electrical load spike by sending a command to trigger an energy buffer selected from: a flywheel, a supercapacitor, and a battery-inverter system (BESS).

19 Claims, 3 Drawing Sheets

PREDICTION AND MITIGATION OF ELECTRICAL LOAD SPIKES

BACKGROUND

The present invention, in some embodiments thereof, relates to machine learning models and, more specifically, but not exclusively, to machine learning models for managing electrical power.

Electrical power utilization by different equipment varies dynamically. Different components are available to handle different situations, for example, an uninterruptible power supply (UPS) and/or a generator may be installed to provide backup power during an outage and/or to protect connected equipment from power problems like surges and sags.

SUMMARY

According to a first aspect, computer implemented method of managing electrical load spikes in a data center, comprises: monitoring a plurality of telemetry parameters of the data center by a plurality of sensors, the plurality of telemetry parameters including at least one of: temperature, voltage and current, feeding the plurality of telemetry parameters into a machine learning model, generating by the machine learning model, a prediction of an imminent electrical load spike exceeding a predefined threshold, wherein the load spike is predicted to occur in the immediate future, and proactively triggering an energy dispatch prior to the occurrence of the predicted electrical load spike by sending a command to trigger an energy buffer selected from: a flywheel, a supercapacitor, and a battery-inverter system (BESS).

According to a second aspect, a computer implemented method of managing electrical power loss in a data center, comprises: monitoring a plurality of telemetry parameters of the data center by a plurality of sensors, the plurality of telemetry parameters including at least one of: temperature, voltage, and current, wherein the data center includes a generator and a plurality of computational components, feeding the plurality of telemetry parameters into a machine learning model, generating by the machine learning model, a prediction of an imminent grid power loss and/or a generator startup event, wherein the grid power loss and/or the generator startup event is predicted to occur in the immediate future, and proactively triggering an energy dispatch prior to the occurrence of the predicted grid power loss and/or startup of the generator by sending a command to trigger an energy buffer to bridge a power gap predicted to occur during the generator startup, for stabilizing a power transition to the generator and/or for preventing collapse of the generator from a sudden high load above a threshold tolerated by the generator, wherein the energy buffer is selected from: a flywheel, a supercapacitor, and a battery-inverter system (BESS).

According to a third aspect, a computer implemented method of managing temperature in a data center, comprises: monitoring a plurality of telemetry parameters of the data center by a plurality of sensors, the plurality of telemetry parameters including at least one of: temperature, voltage, and current, wherein the data center includes a plurality of computational components, feeding the plurality of telemetry parameters into a machine learning model, generating by the machine learning model, a prediction of an imminent electrical load associated with a prediction of a corresponding increase in temperature of the computational components above a temperature threshold indicating a tolerated temperature, wherein the increase in temperature above the temperature predicted to occur in the immediate future, and sending a trigger command to trigger at least one cooling element before the temperature increases above the temperature threshold for preventing overheating of the computational components and/or for maintaining stable thermal conditions in the data center.

In a further implementation form of the first, second, and third aspects, the predefined threshold of the predicted electrical load spike exceeds about 150% of a nominal load.

In a further implementation form of the first, second, and third aspects, the telemetry parameters further include at least one of: airflow, state-of-charge, and power consumption.

In a further implementation form of the first, second, and third aspects, the immediate future comprises an interval about 1-30 seconds from a baseline timestamp associated with the plurality of telemetry parameters.

In a further implementation form of the first, second, and third aspects, the plurality of telemetry parameters are sampled at a rate of about 0.001-1 second, and/or the machine learning model is fed a sequence of the plurality of telemetry parameters sampled over a time interval of about 0.001-1 second.

In a further implementation form of the first, second, and third aspects, further comprising evaluating the prediction using a set-of-rules, and triggering the energy buffer in response to the set-of-rules being met.

In a further implementation form of the first, second, and third aspects, the data center includes a plurality of graphical processing units, and the electrical load spike is predicted to be caused by synchronized GPU workload surges.

In a further implementation form of the first, second, and third aspects, further comprising: wherein the energy buffer comprises a hardware component that includes a pre-charged energy source designed to store a sufficient amount of electrical energy to be discharged until the electrical load spike subsides, wherein the energy buffer returns to its normal charge state after the discharge.

In a further implementation form of the first, second, and third aspects, the proactively triggering is implemented by sending a trigger command via an industrial controller selected from RTU and PLC.

In a further implementation form of the first, second, and third aspects, the energy buffer is selected for, in response to the triggering, dispatching energy before a limit of an uninterruptible power supply (UPS) installed in the data center is exceeded, for avoiding the bypass of the UPS and maintaining a stable supply of power to the data center.

In a further implementation form of the first, second, and third aspects, the energy buffer is selected for, in response to the triggering, smoothing out spikes and/or for avoiding battery cycling.

In a further implementation form of the first, second, and third aspects, the prediction of the imminent electrical load generated by the machine learning model comprises a predicted grid power loss and/or a generator startup event, wherein the command is sent to trigger the energy buffer to bridge a power gap predicted to occur during the generator startup, for stabilizing a power transition to the generator and/or for preventing collapse of the generator from a sudden high load above a threshold tolerated by the generator.

In a further implementation form of the first, second, and third aspects, the prediction of the imminent electrical load is associated with a prediction of a corresponding an increase in temperature of computational components of the data center above a temperature threshold indicating a tolerated temperature, and further comprising sending a trigger command to trigger at least one cooling element before the temperature increases above the temperature threshold for preventing overheating of the computational components and/or maintaining stable thermal conditions in the data center.

In a further implementation form of the first, second, and third aspects, further comprising: monitoring a plurality of health parameters of the data center, and triggering the energy buffer in response to the plurality of health parameters meeting a requirement indicating sufficient health of the data center.

In a further implementation form of the first, second, and third aspects, the plurality of health parameters are selected from: state of charge (SoC), temperature, cooldown, and ramp limits.

In a further implementation form of the first, second, and third aspects, the plurality of telemetry parameters fed into the machine learning model comprise a plurality of sets each respective set including telemetry parameters obtained for each respective computational component, and the prediction of the imminent electrical load spike is for an electrical load consumed by a plurality of computational components of the data center.

In a further implementation form of the first, second, and third aspects, further comprising training the machine learning model on a training dataset of a plurality of records for at least one sample data center, each record including the plurality of telemetry parameters associated with a baseline timestamp and a ground truth indicating whether the electrical load spike occurred during the future time interval after the baseline timestamp or did not occur during the future time interval.

In a further implementation form of the first, second, and third aspects, further comprising: dynamically creating a record comprising the plurality of telemetry parameters and a ground truth indicating whether the predicted electrical load spike occurred during the future time interval or did not occur during the future time interval, and updating the machine learning model using the record.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION

Figure 1:
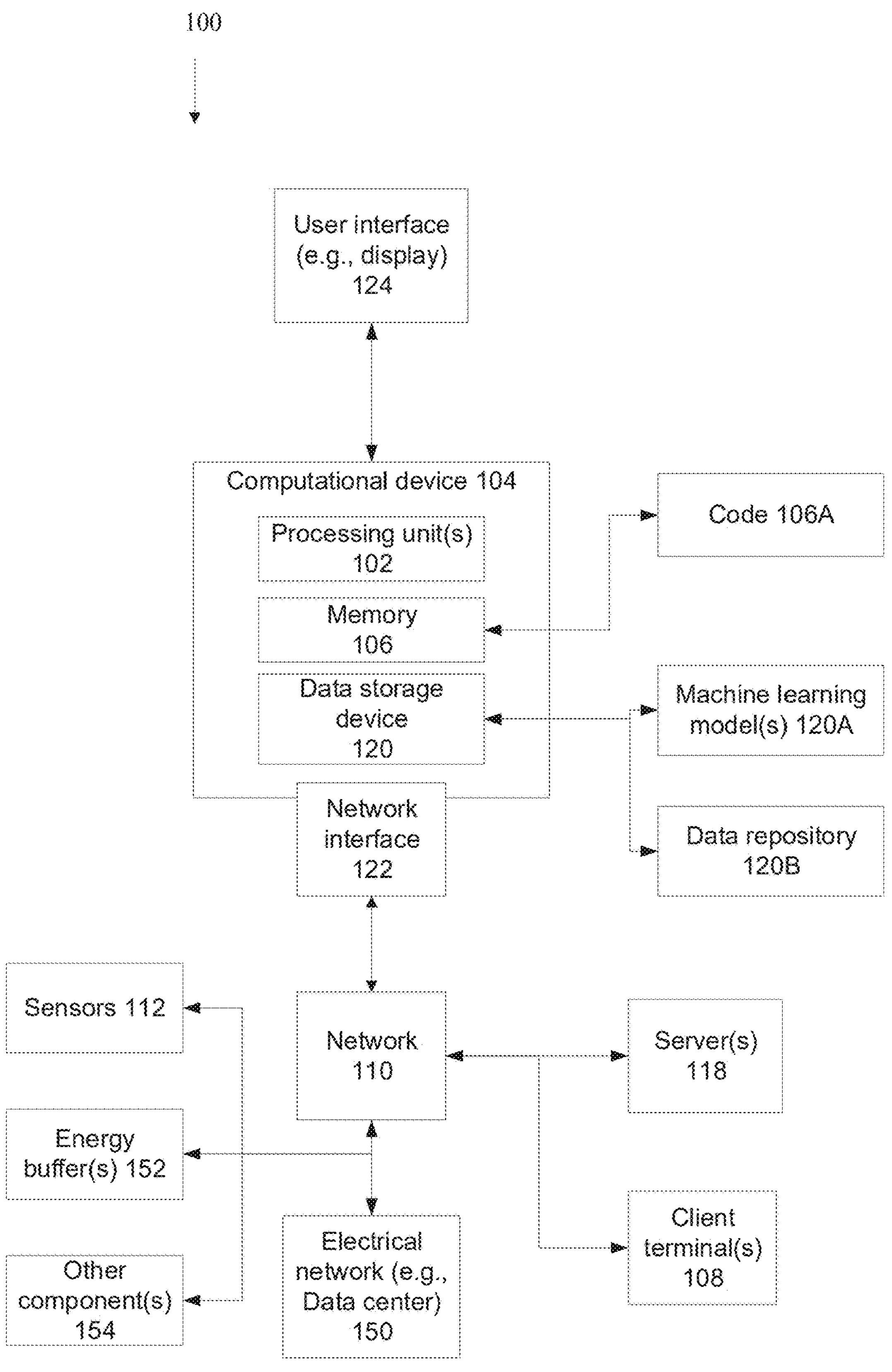
FIG. 1 is a block diagram of components of a system for triggering an energy buffer and/or other electrical component for mitigating predicted extreme electrical variability, optionally load spikes, in an electrical network, optionally a data center, in accordance with some embodiments of the present invention.

The present invention, in some embodiments thereof, relates to machine learning models and, more specifically, but not exclusively, to machine learning models for managing electrical power.

As used herein, the term data center is exemplary and not necessarily limiting. Embodiments described herein may be implemented with respect to other electrical networks with properties similar to a data center, where real time response to a predicted significant imminent variation in electrical load is required.

As used herein, the terms energy buffer and energy source are used interchangeably. The energy buffer or energy source may be pre-charged, and triggered to discharge the stored energy, as described herein.

An aspect of some embodiments of the present invention relates to systems, methods, computing devices, and/or code instructions (stored on a data storage device and executable by one or more processors), for managing electrical load spikes in an electrical network, optionally in a data center. Multiple telemetry parameters of the data center are monitored and/or measured by sensors. The telemetry parameters may include one or more electrical telemetry parameters. Exemplary telemetry parameters include at least one of: temperature, voltage, current, airflow, state-of-charge, and power consumption. The telemetry parameters are fed into a machine learning model. The machine learning model generates a prediction of an imminent electrical load spike exceeding a predefined threshold, for example, at least about 130%-175%, or about 130%, or about 150%, or about 175%, of a nominal load. The load spike is predicted to occur in the immediate future, for example, in the next about 1-30 seconds, or about 1-10 seconds, or about 5-20 seconds, or other values. An energy dispatch is proactively triggered prior to the occurrence of the predicted electrical load spike by triggering (i.e., activating) an energy buffer. The energy buffer may be selected according to the configuration of the electrical network (e.g., data center). Exemplary energy buffers include: a flywheel, a supercapacitor, and a battery-inverter system (BESS). Optionally a single energy buffer is installed and/or triggered per electrical network (e.g., data center) according to site specific requirements. Embodiments described herein may be designed to support different hardware configurations of energy buffers, where each energy buffer may be associated with its own control interface. For example, a data center facing ultra-fast spikes may use a flywheel-based setup, while another site may implement the same predictive control logic with a supercapacitor or a BESS.

An aspect of some embodiments of the present invention relates to systems, methods, computing devices, and/or code instructions (stored on a data storage device and executable by one or more processors) for managing electrical power loss in a data center. The data center includes a generator and computational components. Telemetry parameters of the data center are monitored and/or measured by sensors. The telemetry parameters are fed into a machine learning model. The machine learning model generates a prediction of an imminent grid power loss and/or a generator startup event. The grid power loss and/or the generator startup event is predicted to occur in the immediate future. An energy dispatch is proactively triggered prior to the occurrence of the predicted grid power loss and/or startup of the generator by sending a command to trigger an energy buffer. The command be sent, for example, via a RTU and/or PLC. The release of energy by the energy buffer is timed to bridge a power gap predicted to occur during the generator startup. The release of the energy by the energy buffer is for stabilizing a power transition to the generator and/or for preventing collapse of the generator from a sudden high load above a threshold tolerated by the generator.

An aspect of some embodiments of the present invention relates to systems, methods, computing devices, and/or code instructions (stored on a data storage device and executable by one or more processors) for managing temperature in a data center that includes computational components. Telemetry parameters of the data center are monitored and/or measured by sensors. The telemetry parameters are fed into a machine learning model. The machine learning model generates a prediction of an imminent electrical load associated with a prediction of a corresponding increase in temperature of the computational components above a temperature threshold indicating a tolerated temperature. The increase in temperature above the temperature is predicted to occur in the immediate future. A trigger command to trigger at least one cooling element is sent before the temperature increases above the temperature threshold. The trigger command may be sent, for example, via an RTU, PLC, or HVAC. The trigger command is sent for preventing overheating of the computational components and/or for maintaining stable thermal conditions in the data center.

At least one embodiment addresses the technical problem of managing extreme power variations in a data center that existing components, such as UPS and generator systems, cannot handle in time. Such extreme power variations may damage equipment even when existing components attempt to manage the power variation. The extreme power variation may cause, for example, UPS bypass, unstable power supply, accelerated battery degradation, and even a shutdown or burning of critical equipment. The extreme power variation may further cause, for example, system downtime, high operational costs, and energy inefficiency.

Examples of extreme power variations that are technically challenging to manage using existing approaches, and which may be mitigated by at least one embodiment, include:

- Electrical load spike above a threshold, for example, above about 130%, or 150%, or 175%, or other values, above a nominal load.
- Electrical load spikes that occur very fast, for example, less than about 5 seconds, or 3 seconds, or 1 second, or 0.1 second, or 0.01 second, or 0.001 second.
- Grid power loss
- Electrical load that increases a temperature of computational components above a tolerated temperature threshold. The increase in temperature may damage the components.

Managing power in a data center is especially challenging and different that managing power in other electrical grids (e.g., homes in a city grid powered by a local power station, and/or in a building). The data center may be a specialized facility that houses a large number of computers, servers, storage systems, and networking equipment used to store, process, and distribute large amounts of digital data. The data center may be an AI-driven data center. The data center may provide the backbone of, for example, cloud services, websites, AI systems, banking operations, and other data-driven technologies. Examples of technical challenges in managing power in the data center include:

- Massive Energy Demand: Each component may consumes significant electricity, or a large number of components may together consume a significant amount of energy, for example, large data centers can use tens or hundreds of megawatts-comparable to small cities. Significant variability in power demand is challenging to manage.
- Heat Generation and Cooling Needs: Servers and/or processors generate a lot of heat, which is removed to prevent overheating. Cooling systems (like air conditioning or liquid cooling) consume additional power-often 30-50% of the total energy. Since variability of operation of the servers and/or processors may vary significantly, the heat generation may vary significantly, making it challenging to effectively operate cooling systems.
- Reliability and Redundancy Requirements: In many cases, there is a requirement that data centers must never go down. To prevent downtime, additional equipment is installed, for example, backup power supplies, UPS systems, and generators. These additional pieces of equipment may generate additional technical challenges, such as correct operation and/or for avoiding damage to the existing servers and/or processors.
- Dynamic Workloads: Power demand fluctuates as workloads (AI training, storage access, etc.) change. Managing power efficiently while keeping performance stable is technically challenging.

At least one embodiment improves upon existing approaches for managing extreme load surges (e.g., above 150% or nominal load). Some existing approaches are now described.

In an example, other approaches are based on providing a UPS systems integrated with lithium-based Battery Energy Storage Systems (BESS) with an enlarged battery bank for handling extreme load surges. In data centers, installation of very large battery banks allows the UPS to supply energy during severe load spikes and prevent immediate collapse. However, enlarging the battery bank leads to large costs in physical space, weight, and maintenance. The large battery bank causes overheating and accelerated battery degradation due to frequent stress cycles. The response time of the large battery bank is too slow to address the millisecond-scale load ramp of AI clusters. Moreover, even with the installed large battery bank, the UPS systems still often enter BYPASS mode during sharp spikes, exposing critical equipment to unstable power supply. In contrast, at least one embodiment does not require oversized battery banks. Load surges may be predicted (e.g., about 1-30 seconds or other ranges) in advance, enabling a proactive actuation of an energy buffer (e.g., a flywheel or fast buffer), which prevents UPS bypass and/or significantly reducing battery wear. In contrast to existing approaches that rely on oversized battery banks to absorb the surge—leading to massive losses in space, maintenance, and battery lifetime—at least one embodiment predicts the electrical utilization spike ahead of time and engages fast-response energy storage (e.g., flywheel and/or supercapacitor), which prevents the surge from occurring at the UPS level instead of trying to absorb it reactively.

In another example, other existing approaches are based on providing a DCIM (Data Center Infrastructure Management) platforms for monitoring and control of data center electrical and/or cooling systems. These platforms focus on visibility, alarms, and operational analytics to support operators in managing power distribution and energy efficiency. These platforms are widely deployed in large data centers to monitor UPS performance, track energy usage, detect alarms, and provide dashboards for operators. They help in long-term energy optimization and operational planning. However, these platforms cannot provide a predictive response to ultra-fast load spikes (e.g., milliseconds to seconds). The platforms only provide monitoring and alerts after conditions have already occurred. Operation of these platforms is dependent on operator intervention-actions are not automated in real time. These platforms cannot directly control energy buffers (e.g., flywheel, supercapacitor) with millisecond response. These platforms are designed for steady loads and gradual planning, not for extreme load surges. In contrast to existing approaches that provide monitoring after the events have occurred, at least one embodiment provides automated, predictive actuation of energy buffers before the surge happens, not just monitoring after the fact. This ensures real-time protection of equipment and eliminates operator dependency during critical milliseconds. While DCIM platforms focus on monitoring, visualization, and alarms, they lack the ability to predict and act proactively at the electrical level. In contrast, at least one embodiment integrates predictive AI models with direct energy buffer actuation, enabling intercepting surges before they impact the UPS, which DCIM systems cannot achieve.

At least one embodiment provides the practical application of protecting components of the electrical network (e.g., data center). For example:

- Protecting computational components (e.g., processors, graphical processing units (GPUs) of the data center from damage by the data surge.
- Maintaining stability of the uninterruptible power supply (UPS) during the data surge.
- Avoiding bypass of the UPS as a result of the data surge.

Potential advantages of at least one embodiment described herein include:

- Real-time predictive load forecasting (e.g., using an AI model, also referred to herein as a machine learning model), for example, about 1-30 seconds ahead.
- Proactive dispatch at millisecond scale.
- Reduced dependency on batteries
- Uses an energy buffer, for example, a flywheel and/or supercapacitor.
- Direct real-time activation of energy buffers, for example, a flywheel, a supercapacitor, and/or BESS.
- Millisecond-scale actuation, and not a delayed operator response.
- Integrated safety gates and automatic decision logging.
- In some embodiments, designed specifically for extreme AI load surges (>150%).
- Major savings in space, cooling, and maintenance costs.
- High reliability with safety gates and full decision logging.

At least one embodiment solves the aforementioned technical problem, and/or improves the aforementioned technology, and/or improves upon the aforementioned technical approaches, and/or provides the aforementioned practical applications and/or potential advantages, by monitoring and/or measuring multiple telemetry parameters of the data center by sensors. The telemetry parameters are fed into a machine learning model, which generates a prediction of an imminent electrical load spike exceeding a predefined threshold. The load spike is predicted to occur in the immediate future. An energy dispatch is proactively triggered prior to the occurrence of the predicted electrical load spike by triggering (i.e., activating) an energy buffer. Exemplary energy buffers include: a flywheel, a supercapacitor, and a battery-inverter system (BESS). The prediction may be made in real time, enabling real time triggering of a fast energy buffer to preempt and mitigate the load spike.

At least one embodiment operates as an intelligent, early-warning and/or trigger layer. At least one embodiment detects an imminent electrical load spike, and sends a trigger command to activate a pre-charged energy buffer (i.e., energy source), for example, a flywheel, supercapacitor, or BESS. The operation of at least one embodiment is in contrast to performing continuous power regulation such as operating as a direct power control regulator. At least one embodiment does not necessarily calculate how much energy to dispatch in real time. Rather, the energy source discharges its stored energy over a short duration, selected to cover a time interval until the predicted spike subsides. The energy source returns to its normal charging state after the discharge.

At least one embodiment addresses the technical problem of premature degradation of UPS batteries due to frequent deep cycling and unnecessary discharges during transient power spikes. Existing approaches are based on installing larger battery banks or using battery management systems (BMS) to limit cycling. Oversizing the UPS battery bank spread the load over more cells. Using a BMS with stricter thresholds limit discharge cycles. Adding large capacitor banks absorbs spikes. The oversized battery bank provides more capacity but increases cost, size, heat, and maintenance needs. Stricter BMS thresholds reduces battery wear but risks missing critical support events, lowering system reliability. Capacitor banks respond quickly but provide only very short duration support and are not sufficient for repeated spikes.

At least one embodiment provides are solution to the aforementioned technical problem by using a predictive AI model with a fast-response storage, optionally a hybrid fast-response storage (e.g., flywheel and/or supercapacitor) to protect batteries. Such fast-response storage technologies are usually applied only for short ride-through or energy efficiency, and are operated for preventing unnecessary battery cycling in UPS systems. At least one embodiment uses the fast-response storage for preventing unnecessary battery cycling in UPS systems.

At least one embodiment prevents unnecessary battery use altogether by predicting spikes in advance and shifting the initial response to a flywheel and/or hybrid buffer. This both extends UPS battery lifetime significantly and ensures reliable operation under extreme (e.g., AI) load surges. Unlike oversized batteries or simple BMS rules, at least one embodiment provides a smart, proactive, and hybrid approach that is both more efficient and more cost-effective.

At least one embodiment addresses the technical problem of delayed activation of cooling/HVAC systems during load spikes causes rapid overheating of servers and/or GPUs (or other components), leading to performance degradation, outages, and possible equipment damage. Existing approaches rely on temperature-based triggers or standard HVAC BMS controls that activate only after overheating has begun. Other existing approaches are based on activating cooling systems solely based on temperature sensors. Simple statistical BMS algorithms are used to predict overall thermal demand. Constant cooling capacity is overprovisioned for the entire data hall. Temperature-based activation reacts too late, only after GPUs or servers are already hot. Statistical BMS algorithms are based on averages/trends, which are not precise enough for GPU-level surges. Constant overprovisioning is costly, wasteful, and not targeted (i.e., cools everything, not the hotspot). Existing approaches do not use predictive electrical load forecasting to preemptively activate cooling, and especially do not control cooling at the GPU or rack level, since electrical load prediction and localized thermal management have traditionally been treated as separate domains. In contrast, at least one embodiment predicts the electrical load surge in advance and trigger cooling before overheating occurs, with the ability to target cooling down to the GPU or rack level. This provides proactive, localized protection, prevents thermal shutdowns, safeguards high-value GPUs, and improves energy efficiency by cooling where needed instead of overprovisioning the entire facility.

At least one embodiment addresses the problem of instability of generator startup during grid outages. When a data center switches to backup generators, the generators often collapse if required to immediately supply a high amount (e.g., 100%) of the load, causing blackouts and equipment damage. Existing approaches rely on oversizing generators with higher capacity and/or using staged/sequential load transfer mechanisms (e.g., switches) to reduce startup stress. Other approaches use large capacitor banks for transient smoothing. Oversized generators are reliable but extremely costly, inefficient, and with high fuel consumption and $CO_2$ emissions. Staged transfer mechanisms reduce shock but delay full service availability, risking downtime during startup. Capacitor banks are very fast but provide only milliseconds of support, which is insufficient for generator stabilization. Existing approaches do not apply a predictive AI buffer system (e.g., using flywheel and/or supercapacitor and/or UPS orchestration) to smooth the generator startup, since such systems are typically used for UPS ride-through, not for managing generator ramp-up stability. At least one embodiment addresses the aforementioned technical problem by predicting a grid outage and generator engagement and proactively dispatching energy from the flywheel or hybrid buffer to smooth the transition. This prevents the generator from facing the full load instantly, avoids startup collapse, and/or ensures uninterrupted power delivery. Unlike oversized hardware or simplistic staging, at least one embodiment offers a smart, predictive, and energy-efficient orchestration that increases reliability while reducing costs.

At least one embodiment addresses the aforementioned technical problem by predicting a grid power loss and/or a generator startup event, and sending an early trigger command (e.g., via an RTU or PLC) to a pre-charged energy source (e.g., flywheel, supercapacitor, or BESS) in order to bridge a power gap that is predicted to occur during the imminent generator startup. The discharge of energy is triggered for stabilizing the transition of power to the generating. In at least one embodiment, the generator itself is not directly managed. At least one embodiment may act as an intelligent predictive and proactive trigger layer designed to prevent a brief power collapse and/or ensure power continuity until the generator reaches full operation.

At least one embodiment addresses the technical problem of lack of integrated monitoring of GPU (or other components') health and/or workload utilization leading to premature GPU failures, inefficient resource allocation, and high operational costs. Existing tools such as cluster managers that schedule jobs across GPUs provide GPU utilization metrics but operate separately from the power management layer. Other examples of existing approaches include local GPU monitoring software (e.g., vendor tools), and manual monthly reporting by IT staff. Local GPU monitoring provides raw metrics but no integration with energy control or predictive protection. Cluster managers balance jobs but do not track long-term GPU health or electrical stress. Manual reporting is slow, costly, and prone to errors. Existing approaches do not integrate predictive electrical load forecasting with GPU-level health monitoring to provide a unified solution that both stabilizes power and manages GPU lifecycle. At least one embodiment integrates GPU (or other component's) health metrics (e.g., temperature, current draw, runtime hours) with predictive load management, generating automatic monthly reports of GPU usage (e.g., who used it, how much, and utilization percentage). This enables proactive maintenance, prevents premature GPU burnout, optimizes workload allocation, and reduces operational costs-all while ensuring stable power delivery.

Additional improvements over a prior approach are now described:

A prior approach manages datacenter power allocation through predictive modeling and refined forecasting for policy enforcement and redundancy planning (e.g., 2N). In contrast, at least one embodiment focuses on real-time prevention of sudden load spikes (e.g., >150%), ensuring UPS stability, avoiding BYPASS, and protecting equipment.

The prior approach uses machine learning to generate and refine power usage forecasts at the rack or cluster level. In contrast, at least one embodiment uses AI models at millisecond-second resolution, in particular targeting synchronized GPU workload surges, and triggers proactive energy dispatch before the spike occurs.

The prior approach considers UPS, batteries, and generators as resources for allocation based on policy. In contrast, at least one embodiment actively orchestrating hybrid fast-response storage (e.g., flywheel, supercapacitor, UPS) in real time to smooth spikes and avoid unnecessary battery cycling.

The prior approach does not describe handling UPS BYPASS situations under extreme surges. In contrast, at least one embodiment explicitly prevents UPS BYPASS by dispatching energy buffers before the UPS limit is exceeded, maintaining stable supply.

The prior approach includes generators as part of available power sources but does not solve instability during startup. In contrast, at least one embodiment anticipates grid loss and generator startup, using buffers to smooth the transition and prevent generator collapse under sudden full load.

The prior approach relates to HVAC as part of datacenter infrastructure but without proactive activation. In contrast, at least one embodiment links power surge prediction with cooling, enabling early activation of HVAC and localized GPU/rack-level cooling before overheating occurs.

The prior approach forecasts power usage at rack/cluster level. In contrast, at least one embodiment monitors and forecasts down to individual GPUs (current, voltage, temperature) and may generate monthly utilization/health reports for proactive maintenance.

The prior approach defines a policy and forecasting platform that improves long-term energy allocation. In contrast, at least one embodiment provides a real-time predictive orchestration system that integrates AI forecasting, hybrid energy buffers, UPS/generator stabilization, and GPU-level cooling/health-addressing fast, extreme, and dynamic loads that the prior art cannot.

Exemplary use cases are now described. In an example, during AI model training, hundreds of GPUs start simultaneously, causing a sudden load surge of more than 150% of nominal capacity. The spike is predicted about 5-10 seconds in advance. Energy is proactively dispatched from the flywheel, preventing the UPS from entering BYPASS mode and ensuring uninterrupted power supply. In another example, in the event of a grid outage, the backup generator requires several seconds to stabilize. A hybrid energy buffer (e.g., flywheel and supercapacitor) is discharged during the transition, smoothing the ramp-up and preventing the generator from collapsing under the full instant load.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
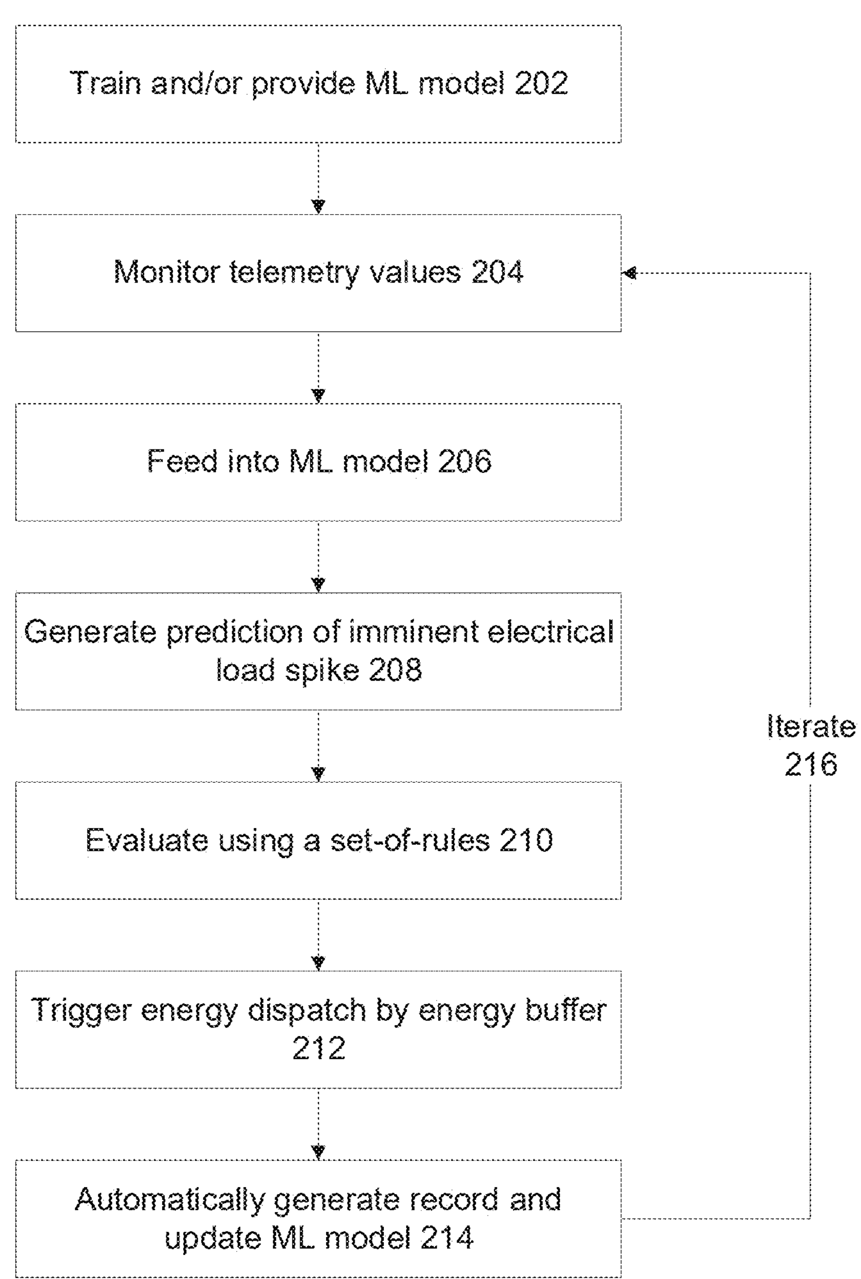
FIG. 2 is a flowchart of a method for triggering an energy buffer for mitigating a load spike in an electrical network, optionally a data center, in accordance with some embodiments of the present invention.
Figure 3:
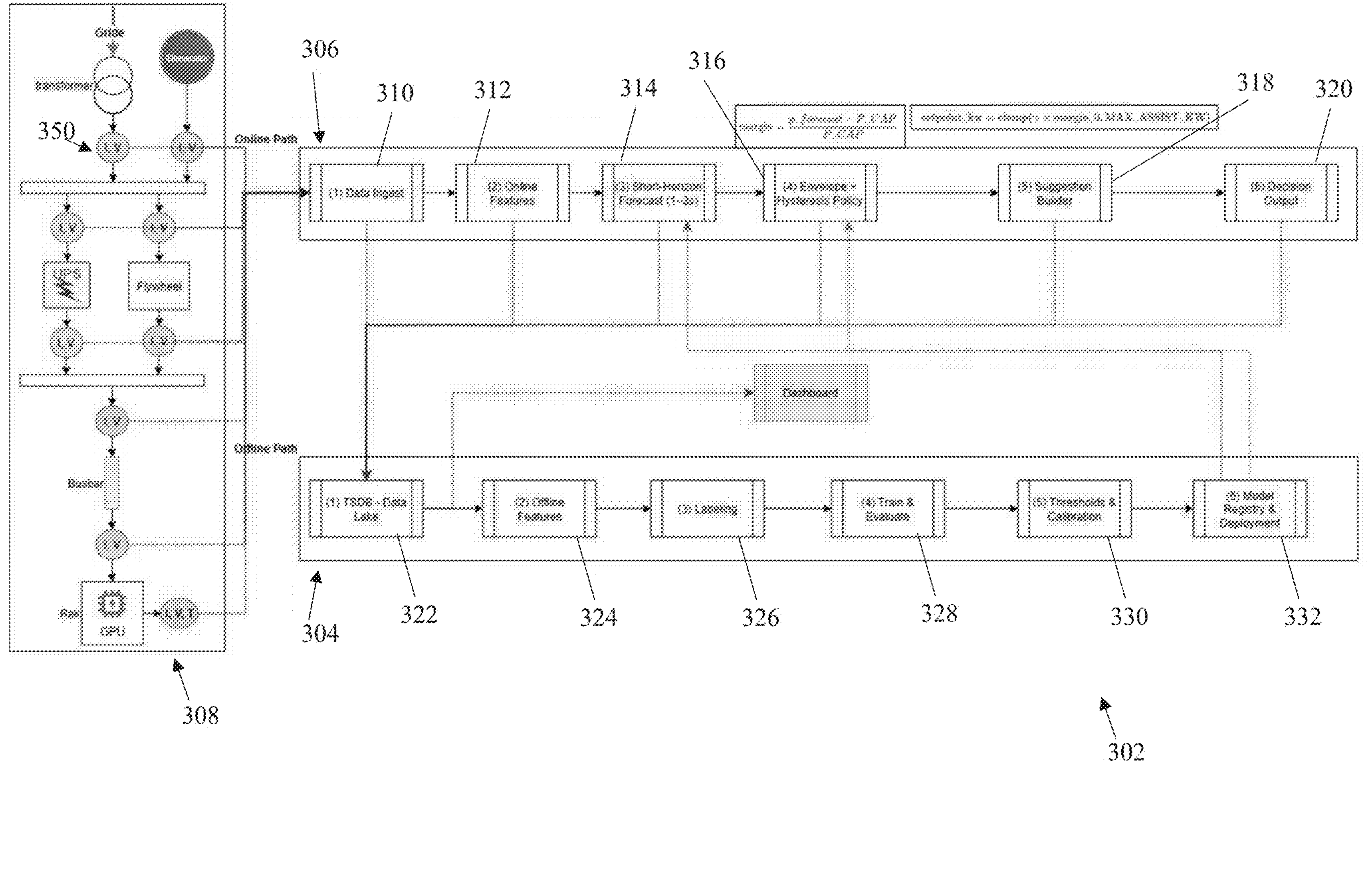
FIG. 3 is a dataflow diagram of an online path and an offline path for operating an energy buffer for mitigating electrical surges in a datacenter, in accordance with some embodiments of the present invention.

Reference is now made to FIG. 1, which is a block diagram of components of a system 100 for triggering an energy buffer 152 and/or other electrical component 154 for mitigating predicted extreme electrical variability, optionally load spikes, in an electrical network 150, optionally a data center, in accordance with some embodiments of the present invention. Reference is also made to FIG. 2, which is a flowchart of a method for triggering an energy buffer for mitigating a load spike in an electrical network, optionally a data center, in accordance with some embodiments of the present invention. Reference is also made to FIG. 3, which is a dataflow diagram 302 of an online path 304 and an offline path 306 for operating an energy buffer for mitigating electrical surges in a datacenter 308, in accordance with some embodiments of the present invention.

Referring now back to FIG. 1, system 100 may implement the features of the method(s) described herein, for example with reference to FIG. 2 and/or FIG. 3, by one or more hardware processors 102 of a computing device 104 executing code instructions stored in a memory (also referred to as a program store) 106.

Computing device 104 monitors telemetry parameters of electrical network 150 sensed via one or more sensors 112, and operates energy buffer 152 and/or other component(s) 154 (e.g., cooling element) for handling electrical spikes or power outages with generator startup predicted by one or more machine learning models 120A.

Electrical network 150 may be implemented as a data center. As used herein, the term data center is an exemplary and not necessarily limiting example of the electrical network.

Computing device 104 may be implemented as, for example, a client terminal, a server, a virtual machine, a virtual server, a computing cloud, a group of interconnected computers, and the like.

In an exemplary centralized implementation, computing device 104 storing code 106A may be implemented as one or more servers (e.g., network server, web server, a computing cloud, a virtual server) that provides services (e.g., one or more of the acts described with reference to FIGS. 2-3 and/or other methods described herein) to one or more data centers 150, optionally managed by one or more servers 118 and/or client terminals 108. Services may be provided over a network 110, for example, providing software as a service (SaaS) to the data center 150 and/or servers 118 and/or client terminal(s) 108, providing software services accessible using a software interface (e.g., application programming interface (API), software development kit (SDK)), providing an application for local download to the data center 150 and/or servers 118 and/or client terminal(s) 108, and/or providing functions using a remote access session to the data center 150 and/or servers 118 and/or client terminal(s) 108, such as through a web browser and/or viewing application. Each data center 150 is monitored by one or more sensor 112, which collected telemetry parameters. The parameters may be provided to computing device 104 via network 110, directly and/or via associated server(s) 118 and/or client terminal(s) 108. Computing device 104 feeds the parameters into one or more ML models 120A to obtain a prediction of an imminent significant electrical power variation, such as spike or loss of power. Computing device 104 generates instructions for operating energy buffer(s) 152 and/or other component(s) 154 for mitigating the electrical power variation.

In an exemplary localized implementation, code 106A is locally executed by computing device 104. For example, computing device 104 locally monitors a respective data center 150. Parameters collected by sensors 112 are locally fed into ML model 120A. Energy buffer(s) 152 and/or other component(s) 154 are locally operated.

Exemplary sensors 112 include: temperature sensor for sensing temperature, airflow sensor for sensing air flow, charge sensor for measuring a state-of-charge, power consumption sensor for sensing power consumption, and voltage sensor for sensing voltage.

Sensors 112 may transmit captured and/or measured telemetry parameters to computing device 104, for example, via a direct connected (e.g., local bus and/or cable connection and/or short range wireless connection), and/or via a network 110 and a network interface 122 of computing device 104 (e.g., where sensors 112 are connected via a wireless network, internet of things (IoT) technology and/or are located remotely from the computing device).

Exemplary energy buffers 152 include: a flywheel, a supercapacitor, and a battery-inverter system (BESS). The energy buffers may be designed to release a predefined amount of energy over a predefined time interval, optionally a large amount of energy over a relatively short time interval. For example, at least about 125%, or 150%, or 175% of a nominal power load, over about 1-5 seconds, or about 1-30 seconds, or about 1-10 seconds, and the like.

Exemplary other components 154 include: one or more cooling elements, for example, a heating, ventilation, and air conditioning (HVAC) unit, a fan, and the like.

Network interface 122 may be implemented as, for example, a wire connection (e.g., physical port), a wireless connection (e.g., antenna), a network interface card, a wireless interface to connect to a wireless network, a physical interface for connecting to a cable for network connectivity, and/or virtual interfaces (e.g., software interface, application programming interface (API), software development kit (SDK), virtual network connection, a virtual interface implemented in software, network communication software providing higher layers of network connectivity).

Memory 106 stores code instructions executable by hardware processor(s) 102. Exemplary memories 106 include a random access memory (RAM), read-only memory (ROM), a storage device, non-volatile memory, magnetic media, semiconductor memory devices, hard drive, removable storage, and optical media (e.g., DVD, CD-ROM). For example, memory 106 may store code 106A that execute one or more acts of the method described with reference to FIG. 2 and/or FIG. 3 and/or other methods described herein.

Computing device 104 may include data storage device 120 for storing data, for example, machine learning model(s) 120A for predicting imminent electrical spikes and/or power outages, and/or data repository 120B for storing data such as the received parameters, dynamically generated records for training and/or updating ML model(s) 120A, and the like.

Data storage device 120 may be implemented as, for example, a memory, a local hard-drive, a removable storage unit, an optical disk, a storage device, a virtual memory and/or as a remote server 118 and/or computing cloud (e.g., accessed over network 110).

Computing device 104 may include and/or be in communication with one or more physical user interfaces 124 that include a mechanism for inputting data and/or for viewing data, for example, a display for presenting data such as predicted electrical spikes and operated energy buffer. Exemplary user interfaces 124 include, for example, one or more of, a touchscreen, a display, a keyboard, a mouse, and voice activated software using speakers and microphone.

Referring now back to FIG. 2, at 202, a machine learning (ML) model is trained and/or provided (e.g., accessed).

The ML model is trained on a training dataset of records, which may be generated from data collected from at least one sample data center. Each record includes telemetry parameters which are monitored and/or measured by sensors, for example, as described with reference to 204. The telemetry parameters are associated with a baseline timestamp. The record may further include a ground truth indicating whether an electrical load spike occurred during a future time interval after the baseline timestamp or did not occur during the future time interval. The electrical load spike may be associated with another timestamp. The record may indicate the difference between the baseline timestamp of the telemetry parameters and the electrical load spike, which may be selected to be, for example, between about 1-30 seconds or other ranges as described herein.

Exemplary architectures of the ML model include, for example, statistical classifiers and/or other statistical models, neural networks of various architectures (e.g., convolutional, fully connected, deep, encoder-decoder, recurrent, transformer, graph), support vector machines (SVM), logistic regression, k-nearest neighbor, decision trees, boosting, random forest, a regressor, and/or any other commercial or open source package allowing regression, classification, dimensional reduction, supervised, unsupervised, semi-supervised, and/or reinforcement learning. Machine learning models may be trained using supervised approaches and/or unsupervised approaches.

Other exemplary architectures of the ML model include, for example, an autoregressive model, an autoregressive with exogenous inputs model, and a Kalman filter.

The ML model may be designed for efficient inference of an input of telemetry parameters using available processing resources, for enabling rapid inference to provide sufficient time in advance of a predicted load spike.

The training dataset may be, for example, a generic dataset for different types of electrical networks and/or different types of data centers. Alternatively, the training dataset may be of a specific type, such as a specific type of data center, for example, a data center for training artificial intelligence (AI) models and/or for inference by the AI model(s).

At 204, one or more telemetry parameters of the data center are monitored and/or measured by one or more sensors. The terms monitoring and measuring may be used interchangeably. The telemetry parameters may include electrical telemetry parameters.

Examples of telemetry parameters and corresponding sensors include:

- Temperature by a temperature sensor. For example, a thermistor, thermocouple, resistance temperature detector (RTD), infrared sensor, or any other temperature sensing device.
- Voltage by a voltage sensor. For example, a resistive divider, differential amplifier, analog-to-digital converter, or other circuitry suitable for detecting a voltage level.
- Current by a current sensor. For example, a shunt resistor, Hall Effect sensor, Rogowski coil, current transformer, or other circuitry configured to detect current flow.
- Airflow by an airflow sensor. For example, a thermal anemometer, differential pressure sensor, turbine flow sensor, or other device suitable for detecting the rate and/or direction of airflow.
- State-of-charge by a state-of-charge-sensor designed to determine a charge level of an energy storage device (e.g., the energy buffer) and generate a corresponding output signal. For example, a voltage-based estimator, coulomb counter, impedance measurement circuit, or a combination thereof configured to determine a remaining charge of the energy storage device.
- Power consumption by a power consumption sensor designed to determine an amount of electrical power consumed by a load. For example, a combination of voltage and current sensors, a power metering integrated circuit, or computational logic configured to estimate power usage The telemetry parameters may be monitored and/or measured, for example, per component of the data center, per set of components (e.g., rack), and/or for the data center as a whole.

The telemetry parameters may be monitored and/or measured at a sampling a rate of, for example, about 1 Hertz, or about 10 Hertz, or about 100 Hertz, or about every 0.001 to 1 second, or about 0.05 to 2 seconds, or about 0.001 to 0.01 seconds, or about 0.01 to 0.1 seconds, or about 0.1 to 1 second, or other ranges. The sampling rate may be selected to provide sufficient amount of real time data of the current electrical state of the data center to enable accurate prediction.

The telemetry parameters may include features computed from the measured data, optionally over a time window, including rolling statistics, for example, mean, maximum, standard deviation, z-score, and slope. The time window may be, for example, about 0.5 seconds to about 3 seconds, or about 0.1 to 5 seconds, or other ranges.

At 206, the telemetry parameters are fed into a machine learning model.

The telemetry parameter may be fed into the machine learning model as a combination, for example, as a vector that includes a concatenation of multiple parameters.

The telemetry parameters may be fed into the machine learning model as they are received and/or measured, at a rate corresponding to the sampling rate of the telemetry parameters. Alternatively or additionally, the telemetry parameters may be fed into the machine learning as a sequence. The sequence may be collected over a time interval of multiple samples, and fed into the machine learning model at a rate corresponding to the time interval. For example, when the sample rate is 0.1 seconds, 10 samples may be collected over 1 second and fed into the ML model every second. The machine learning model may be fed a sequence of telemetry parameters sampled over a time interval of about 0.001-1 second, or about 0.05 to 2 seconds, or about 0.001 to 0.01 seconds, or about 0.01 to 0.1 seconds, or about 0.1 to 1 second, or other ranges. The feeding may be selected to enable a sufficient amount of time prior to a prediction without overloading the processing resources that perform inference by the machine learning model.

At 208, a prediction of an imminent electrical load spike exceeding a predefined threshold is generated by the machine learning model.

The load spike is predicted to occur in the immediate future, during an interval about 1-30 seconds in the future, or about 0.5-5 seconds, or about 5-30 seconds, or about 1-5 seconds, or about 2-10 seconds, and the like. The predication may be for a future defined as starting from a baseline timestamp associated with the telemetry parameters (e.g., indicating a time of sensing and/or measuring the telemetry parameters).

Alternatively or additionally, the ML model may predict whether the load spike will occur at one or more future times, for example, 1 second in the future, 2 seconds in the future, and the like.

The predefined threshold may be of the predicted electrical load spike exceeding about 125%, or about 150%, or about 175% of a nominal load.

In an implementation in which the data center includes multiple graphical processing units, the electrical load spike may be predicted to be caused by synchronized GPU workload surges.

In an implementation in which the telemetry parameters being fed into the machine learning model include multiple sets, where each respective set includes telemetry parameters obtained for each respective computational component, the prediction of the imminent electrical load spike may be is for the multiple computational components.

At 210, the prediction may be evaluated using a set-of-rules.

The set-of-rules may define a requirement of monitored and/or measured health parameters of the data center, for example, thresholds and/or ranges of values of the health parameters. The health parameters may include operational indicators of equipment health within the data center, such as of servers, GPUs, UPS units, and other power infrastructure.

Exemplary health parameters include: state of charge (SoC), temperature, cooldown, and ramp limits.

Optionally, a relative load index is computed based on the health parameters. The relative load index may reflect how each component of the data center is loaded compared to other components.

A real-time health report may be generated based on the relative load index and/or health parameters. The real-time health report may indicate, for example, the operational state, utilization percentage, and/or working time of each component relative to the overall system.

Monitoring of the health parameters may provide insights into, for example, equipment performance, efficiency, and/or reliability.

Monitoring of the health parameters may be used for supporting predictive maintenance and/or operational optimization, without requiring direct control over information technology (IT) hardware.

At 212, an energy dispatch is proactively triggered prior to the occurrence of the predicted electrical load spike, by sending a command to an energy buffer.

Optionally, the energy buffer is triggered in response to the set-of-rules being met. The energy buffer may be triggered in response to the health parameters meeting a requirement indicating sufficient health of the data center. Alternatively, the energy buffer may not be triggered when the set-of-rules is not met, even when the ML model predicts an imminent load spike. For example, the set-of-rules may indicate that the health parameters of the data center indicate likelihood of damage to the components by triggering the energy buffer.

The energy buffer may be implemented as a hardware component that includes a pre-charged energy source designed to store a sufficient amount of electrical energy to be discharged until the electrical load spike subsides. The ML model may be trained according to the property of the energy buffer. For example, when the energy buffer is designed to discharge energy a certain amount of energy over a known time interval, the ML model may be trained to predict load spikes above the certain amount of energy discharged by the energy buffer, which are expected to occur in a future time window less than the amount of time that the energy buffer discharges its energy. The energy buffer is designed to return to its normal charge state after the discharge. Exemplary energy buffers include: a flywheel, a supercapacitor, and a battery-inverter system (BESS).

The energy buffer may be selected for dispatching energy (in response to being triggered) before a limit of an uninterruptible power supply (UPS) installed in the data center is exceeded, for avoiding the bypass of the UPS and/or for maintaining a stable supply of power to the data center.

The energy buffer may be selected for smoothing out spikes and/or for avoiding battery cycling, in response to being triggered.

Optionally, a single energy buffer is selected per data center. The energy buffer may be selected according to the expected electrical load spike, which may be based on the type of components installed at the data center. For example, a data center facing ultra-fast spikes (such as due to simultaneous training of an AI model by multiple processors) may implement a flywheel-based setup, while another site may implement the same predictive control logic with a supercapacitor or a BESS.

The energy buffer may be triggered by a processor generating and/or sending a trigger command to an industrial controller, for example, remote terminal unit (RTU) and/or programmable logic controller (PLC). The processor may trigger the energy buffer without directly controlling and/or regulating power in the data center. The industrial controller may activate the energy buffer in response to the trigger command.

The energy buffer may be activated for a short predefined duration, selected to have a duration until the electrical spike subsides.

At 214, one or more records may be automatically generated. The records may include telemetry parameters that led to the trigger of the energy buffer, or that did not lead to the trigger of the energy buffer. The record may include a ground truth indicating whether the predicted electrical load spike occurred during the future time interval or did not occur during the future time interval. The machine learning model may be automatically updated with the record(s). Optionally, a central ML model may be dynamically updated with different records generated from data from different data centers. Alternatively, a local and/or customized ML model may be dynamically updated with records generated from data from a specific data center serviced by the customized ML model.

The update of the ML may be periodically and/or cyclically, for example, once a day, once a week, once a month, and the like. Alternatively, the ML model may be updated after each event, or after a predefined number of events.

At 216, features described with reference to 204-214 may be iterated over time, for dynamically managing load spikes in the data center.

In some embodiments, features described with reference to FIG. 2 may be adapted to other use cases. For example, with reference to 202, the ML model may be trained on records that include the telemetry parameters and a ground truth indicating whether the grid power loss and/or generator startup event was experienced or not at a future time interval after a baseline timestamp when the telemetry parameters were measured. With reference to 208, the machine learning model predict an imminent grid power loss and/or a generator startup event. At 212, the command is sent to trigger the energy buffer to bridge a power gap predicted to occur during the generator startup. The triggering may be generated for stabilizing a power transition to the generator and/or for preventing collapse of the generator from a sudden high load above a threshold tolerated by the generator.

In another use case, at 202, the ML model may be trained on records that include the telemetry parameters and the ground truth that indicates whether an electrical load spike occurred at a future time interval further indicates temperature of components associated with the electrical load spike. With reference to 208, the ML model predicts whether the predicted imminent electrical load is associated with a prediction of a corresponding increase in temperature of computational components of the data center above a temperature threshold indicating a tolerated temperature (i.e., to a temperate that cannot be tolerated, likely leading to damage of the computational components due to overheating. The prediction may be made per computational component, per rack of multiple computational components, for the data center as a whole, or other sets. At 212, a command is sent to trigger at least one cooling element before the temperature increases above the temperature threshold for preventing overheating of the computational components and/or maintaining stable thermal conditions in the data center. The cooling element(s) include, for example, an air conditioner, a fan, and the like. The cooling may be triggered per computational component, per rack, for the dataset as a whole, or other sets.

The method described with reference to FIG. 2 may be adapted for managing other extreme power abnormalities in an electrical network, such as extreme changes in power availability and/or consumption within a short amount of time. A ML model is trained on a suitable training dataset for prediction of the imminent extreme power abnormality. A command to trigger a component of the electrical network is generated in response to the prediction. The component may be an energy buffer selected to mitigate the extreme power abnormality by providing the needed power within the short amount of time.

Referring now back to FIG. 3, the dataflow described with reference to diagram 302 may be implemented by components of system 100 described with reference to FIG. 1, and/or may be implemented by, and/or combined with, and/or in addition to, and/or alternative to, one or more features described with reference to FIG. 2.

Datacenter 308 includes multiple components, for example, a transformer, a generator, a UPS, a flywheel, a busbar, one or more GPUs, and others. Multiple sensors 350 monitor telemetry parameters. I denotes ampere, V denotes volt, and T denotes temperature.

Online path 304 is now described.

At 310, data is ingested. Real time (i.e., live) measurements are read reliably and on time. Telemetry parameters are polled and/or received. The telemetry parameters are received, stamped with a timestamp, and optionally normalized (e.g., using a schema). A short ring-buffer may be maintained.

At 312, features may be computed. Raw signals (i.e., telemetry parameters) may be turned into meaningful short-term patterns. Rolling statistics may be computed, optionally over tiny windows (e.g., about 0.001-1 second, or about 0.001-0.01, or 0.01-0.1, or 0.1-1 second, or other values). A compact feature vector indicating a current state of datacenter 308 may be generated.

At 314, a prediction is made for the very near future, with just enough time to enable operating the energy buffer to act early. The prediction may be, for example, for the next about 1-30 seconds, or 1-10 seconds, or 5-15 seconds, or other ranges. A fast ML model may perform the prediction. The ML model may be implemented as, for example, an autoregressive model, an autoregressive with exogenous inputs model, and a Kalman filter.

At 316, the prediction is compared to configurable thresholds, optionally an envelope and/or hysteresis policy. Noise may be debounced. The energy buffer is operated when the prediction indicates the requirement to act.

At 318, a suggestion builder process may suggest how much energy is needed and for how long. Alternatively or additionally, the suggestion builder process may indicate how to operate the energy buffer. The suggestion builder process may convert a breach margin into a setpoint (e.g., in kilowatts) and a duration (e.g., in milliseconds).

At 320, a decision output is provided. A single, safe decision is provided, or nothing is done. The decision may be based on running final safety and/or consistency gates. A single event may be generated, for triggering operation of the energy buffer. The data generated in online path 304 may be logged.

Offline path 306 is now described.

At 322, data from the offline path may be stored in a time series database (TSDB) and/or in a data lake. The data is stored to maintain a trustworthy history for learning and/or proving value. Clean immutable snapshots of the telemetry parameters, online features, forecasts, and/or policy results may be exported, for example, to parquet partitions. The export may be performed, for example, daily, hourly, or at other intervals.

At 324, the same computations performed in real time to compute online features may be computed offline to compute offline features. For example, the same rolling windows are used, the same 0.5/⅓ second means, ramps, z-scores, deltas, and other computations, are used. Using the same computations (i.e., math) offline as online may avoid surprises in production.

At 326, labels are determined. For example, what "good" means may be defined, to be used for training and/or measurements. Targets for prediction may be computed, for example, for 1 second ahead, 2 seconds ahead, 3 seconds ahead, and the like. Optionally, classification labels are computed.

At 328, a fast and/or small prediction model is trained. The prediction model may be evaluated on historical data to verify accurate predictions. The model may be trained by splitting the time based data into a training set, validation set, and test set. Signal accuracy and/or decision impact may be evaluated.

At 330, thresholds may be computed. Calibration may be performed. A set of rules defining a policy for when the energy buffer is to be operated and/or by how much, to ensure safety, may be computed. Classifier threshold may be computed.

At 332, the model may be provided, for example, using a controlled release with instant rollback. A model registry may store versioned models, and optionally may store metadata. Approved versions may be promoted to an edge device for first shadowing, then going live.

The following may be computed and/or defined for one or more embodiments:

A true positive (TP) is defined as dispatched (i.e., energy buffer activates) and breach (i.e., spike) happened within T (a time window).

A false positive (FP) is defined as dispatched and no breach occurred within T.

A false negative (FN) is defined as no dispatch and a breach occurred within T.

A true negative (TN) is defined as no dispatch and no breach occurred within T.

Precision is computed as TP/(TP+FP).

Recall (TPR) is computed as TP/(TP+FN).

Accuracy is computed as (TP+TN)/(TP+FP+FN+TN).

$$F1 = 2 * \text{Precision} * \text{Recall}/(\text{Precision} + \text{Recall}).$$

Lead-time (per true positive) indicates how early the energy buffer was operated before the breach.

The following may be computed per event (i.e., spike) for one or more embodiments:

t_breach_ms=time when a real breach actually starts (after dead-band).

t_dispatch_ms=first time a decision=dispatche was issued before that breach (within the next T window).

lead_time_ms=t_breach_ms−t_dispatch_ms.

The median and 95th percentile of lead_time_ms over recent true positives may be presented.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant energy buffers will be developed and the scope of the term energy buffer is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A computer implemented method of managing electrical load spikes in a data center, comprising:

monitoring a plurality of telemetry parameters of the data center by a plurality of sensors, the plurality of telemetry parameters including at least one of: temperature, voltage and current, feeding the plurality of telemetry parameters into a machine learning model;

generating by the machine learning model, a prediction of an imminent electrical load spike exceeding a predefined threshold, wherein the load spike is predicted to occur in the immediate future, wherein the immediate future comprises an interval about 1-30 seconds from a baseline timestamp associated with the plurality of telemetry parameters; and proactively triggering an energy dispatch prior to the occurrence of the predicted electrical load spike by sending a command to trigger an energy buffer selected from: a flywheel, a supercapacitor, and a battery-inverter system (BESS).

2. The computer implemented method of claim 1, wherein the predefined threshold of the predicted electrical load spike exceeds about 150% of a nominal load.

3. The computer implemented method of claim 1, wherein the telemetry parameters further include at least one of: airflow, state-of-charge, and power consumption.

4. The computer implemented method of claim 1, wherein the plurality of telemetry parameters are sampled at a rate of about 0.001-1 second, and/or the machine learning model is fed a sequence of the plurality of telemetry parameters sampled over a time interval of about 0.001-1 second.

5. The computer implemented method of claim 1, further comprising evaluating the prediction using a set-of-rules, and triggering the energy buffer in response to the set-of-rules being met.

6. The computer implemented method of claim 1, wherein the data center includes a plurality of graphical processing units, and the electrical load spike is predicted to be caused by synchronized GPU workload surges.

7. The computer implemented method of claim 1, further comprising:

wherein the energy buffer comprises a hardware component that includes a pre-charged energy source designed to store a sufficient amount of electrical energy to be discharged until the electrical load spike subsides, wherein the energy buffer returns to its normal charge state after the discharge.

8. The computer implemented method of claim 1, wherein the proactively triggering is implemented by sending a trigger command via an industrial controller selected from RTU and PLC.

9. The computer implemented method of claim 1, wherein the energy buffer is selected for, in response to the triggering, dispatching energy before a limit of an uninterruptible power supply (UPS) installed in the data center is exceeded, for avoiding the bypass of the UPS and maintaining a stable supply of power to the data center.

10. The computer implemented method of claim 1, wherein the energy buffer is selected for, in response to the triggering, smoothing out spikes and/or for avoiding battery cycling.

11. The computer implemented method of claim 1, wherein the prediction of the imminent electrical load generated by the machine learning model comprises a predicted grid power loss and/or a generator startup event, wherein the command is sent to trigger the energy buffer to bridge a power gap predicted to occur during the generator startup, for stabilizing a power transition to the generator and/or for preventing collapse of the generator from a sudden high load above a threshold tolerated by the generator.

12. The computer implemented method of claim 1, wherein the prediction of the imminent electrical load is associated with a prediction of a corresponding an increase in temperature of computational components of the data center above a temperature threshold indicating a tolerated temperature, and further comprising sending a trigger command to trigger at least one cooling element before the temperature increases above the temperature threshold for preventing overheating of the computational components and/or maintaining stable thermal conditions in the data center.

13. The computer implemented method of claim 1, further comprising:

monitoring a plurality of health parameters of the data center; and triggering the energy buffer in response to the plurality of health parameters meeting a requirement indicating sufficient health of the data center.

14. The computer implemented method of claim 13, wherein the plurality of health parameters are selected from: state of charge (SoC), temperature, cooldown, and ramp limits.

15. The computer implemented method of claim 1, wherein the plurality of telemetry parameters fed into the machine learning model comprise a plurality of sets each respective set including telemetry parameters obtained for each respective computational component, and the prediction of the imminent electrical load spike is for an electrical load consumed by a plurality of computational components of the data center.

16. The computer implemented method of claim 1, further comprising training the machine learning model on a training dataset of a plurality of records for at least one sample data center, each record including the plurality of telemetry parameters associated with a baseline timestamp and a ground truth indicating whether the electrical load spike occurred during the future time interval after the baseline timestamp or did not occur during the future time interval.

17. The computer implemented method of claim 1, further comprising:

dynamically creating a record comprising the plurality of telemetry parameters and a ground truth indicating whether the predicted electrical load spike occurred during the future time interval or did not occur during the future time interval, and updating the machine learning model using the record.

18. A computer implemented method of managing electrical power loss in a data center, comprising:

monitoring a plurality of telemetry parameters of the data center by a plurality of sensors, the plurality of telemetry parameters including at least one of: temperature, voltage, and current, wherein the data center includes a generator and a plurality of computational components;

feeding the plurality of telemetry parameters into a machine learning model;

generating by the machine learning model, a prediction of an imminent grid power loss and/or a generator startup event, wherein the grid power loss and/or the generator startup event is predicted to occur in the immediate future, wherein the immediate future comprises an interval about 1-30 seconds from a baseline timestamp associated with the plurality of telemetry parameters; and proactively triggering an energy dispatch prior to the occurrence of the predicted grid power loss and/or startup of the generator by sending a command to trigger an energy buffer to bridge a power gap predicted to occur during the generator startup, for stabilizing a power transition to the generator and/or for preventing collapse of the generator from a sudden high load above a threshold tolerated by the generator, wherein the energy buffer is selected from: a flywheel, a supercapacitor, and a battery-inverter system (BESS).

19. A computer implemented method of managing temperature in a data center, comprising:

monitoring a plurality of telemetry parameters of the data center by a plurality of sensors, the plurality of telemetry parameters including at least one of: temperature, voltage, and current, wherein the data center includes a plurality of computational components;

feeding the plurality of telemetry parameters into a machine learning model;

generating by the machine learning model, a prediction of an imminent electrical load associated with a prediction of a corresponding increase in temperature of the computational components above a temperature threshold indicating a tolerated temperature, wherein the increase in temperature above the temperature predicted to occur in the immediate future, wherein the immediate future comprises an interval about 1-30 seconds from a baseline timestamp associated with the plurality of telemetry parameters; and sending a trigger command to trigger at least one cooling element before the temperature increases above the temperature threshold for preventing overheating of the computational components and/or for maintaining stable thermal conditions in the data center.

* * * * *